United States Patent [19]

Rabiet et al.

[11] Patent Number: 5,230,788
[45] Date of Patent: Jul. 27, 1993

[54] INSULATED METAL SUBSTRATES AND PROCESS FOR THE PRODUCTION THEREOF

[75] Inventors: Jacques Rabiet, Goncelin; Philippe Gimenez, Echirolles; Rémi Guillou, Nantes; Claude Drapier, Vaucresson, all of France

[73] Assignee: Pechiney Recherche, Courbevoie, France

[21] Appl. No.: 828,679

[22] Filed: Jan. 31, 1992

Related U.S. Application Data

[62] Division of Ser. No. 506,108, Apr. 9, 1990.

[51] Int. Cl.⁵ .............................................. C25D 11/06
[52] U.S. Cl. ..................................... 205/328; 205/332
[58] Field of Search ................................ 205/328, 332

[56] References Cited

FOREIGN PATENT DOCUMENTS 2206451 1/1989 United Kingdom .

Primary Examiner—T. M. Tufariello
Attorney, Agent, or Firm—Dennison, Meserole, Pollack & Scheiner

[57] ABSTRACT

The disclosure relates to insulated metal substrates and to a process for producing these substrates. These substrates have an aluminium base, an insulant constituted by an alumina film obtained by anodizing at least one of the faces of said base and at least one metal film which is to be transformed by chemical etching into a network of conductors. The alumina film is formed by a uniform compact zone adhering to the aluminium and having a thickness in excess of 500 nm and a porous layer with a rough outer surface. The process of making these substrates includes a step during which at least one of the faces of the aluminium base undergoes a treatment in a porous anodization layer forming bath and then in a barrier anodization layer forming bath. The invention is used in the production of substrates for single face, double face, with metallized holes, and multilayer conductive circuits. The substrates produced have a planar or non-planar configuration, and may also have resistive networks.

7 Claims, 2 Drawing Sheets

INSULATED METAL SUBSTRATES AND PROCESS FOR THE PRODUCTION THEREOF

This is a divisional of copending application Ser. No. 07/506,108, filed Apr. 9, 1990.

TECHNICAL FIELD OF THE INVENTION

The present invention relates to insulated or isolated metal substrates and to their production process. It more particulary applies to the production of printed circuits for the interconnection of electronic power components used e.g. in the car industry. Such circuits can have a planar or spatial configuration and have one or more "single face", "double face with metallized holes" or "multilayer" conductive levels.

PRIOR ART

For a number of years printed circuits for the interconnection of electronic components have been obtained by etching substrates, e.g. constituted by a copper film bonded to an insulating support.

Among materials used as a support for rigid substrates, reference is e.g. made to phenolic resin-impregnated paper, which has in particular been developed in Japan in the general public sector and epoxy resin-impregnated glass fabric, which has largely been reserved for the professional sector as a result of its better electrical performance characteristics. In the case of flexible substrates, polymer films are used as a support, either in the form of polyimide, when good heat resistance is required, or polyester, if the price is an important criterion.

All electrically insulating supports have poor thermal conductivity characteristics and cannot therefore participate in the dissipation of the heat given off by the power components. In order to avoid the destruction of the latter as a result of a rise in their temperature, various solutions have been envisaged, but hitherto none has been entirely satisfactory.

It is also known to position the power components on separate supports of the exchanger type, e.g. made by cutting aluminium wing or fin sections, but then the interconnection function of these components can no longer be integrated onto the printed circuit.

It is also known to use ceramic supports, e.g. of alumina, cordierite or aluminium nitride, which have a good thermal conductivity and then use is made of so-called thick layer or multilayer methods. Unfortunately these materials suffer from the disadvantage of being expensive, fragile and only available in the form of small plates rarely exceeding dm$^2$.

More recently, the technology of surface mounting components on the printed circuit allowing a better heat transfer between the components and the substrate has led to the concept of the insulated or isolated metal substrate, IMS and which is a material constituted by a metal, e.g. aluminium base, which serves as the heat drain, an electricity conducting film, such as e.g. a copper sheet, which can be chemically etched to produce the interconnection circuits and an insulant interposed between the two metals.

The method of using such a substrate is e.g. described in French Patent 2560437, which claims "a process for the production of miniaturized electronic power circuits". The problem occurring in IMS's is to obtain both a good electrical insulation between the base and the sheet and a good heat dissipation by the base. However, the improvement to the first of these quantities can be obtained by increasing the insulant thickness, but this runs counter to the second. It was clear to the Applicant that it was difficult to reconcile these two contradictory requirements in order to achieve the performance levels generally imposed by users.

Thus, e.g. for car uses, it is necessary to guarantee under an applied d.c. voltage of 500V, insulation resistances greater than $10^5 M\Omega$ between the conductors and base or between conductive tracks. Apart from this feature and then need to dissipate the heat given off by the components, it is necessary to ensure a good adhesion of the copper conductors and all these properties must be retained after various environmental tests, such as aging, thermal shocks, exposure to moist heat or immersion in various solvents (e.g. hydrocarbons).

One of the previously proposed solutions consists of using an insulated metal substrate having as its insulant a 25 $\mu$m thick polyimide film, whose two faces must be coated with an adhesive, which leads to a total insulating thickness of approximately 75 $\mu$m. Such a thickness represents a significant shield to heat transfers between the components and the aluminium base.

Another solution described in German Patent DE-A-3626232 is based on the treatment of "oxidizing the entire surface of an aluminium base in order to form an oxide serving as an electrical insulant, applying a thermosetting adhesive to the oxidized base, placing a copper sheet on the adhesive film and heating the composite in order to harden the adhesive film, said oxidation being carried out electrolytically, i.e. by anodization".

However, the latter Patent fails to give any details regarding the electrical insulation characteristics obtained between the aluminium base and the copper conductors, or the thermal dissipation by the base.

It is in order to improve this situation that the Applicant has investigated a solution using an anodic oxide coating, which a priori has the advantages of good thermal conductivity, high electrical insulation, direct adhesion to the aluminium and the possibility of obtaining an external roughness favourable to the adhesion of the conductive film.

OBJECT OF THE INVENTION

The Expert knows that the anodic oxidation of aluminium can lead, as a function of the anodization conditions and in particular the nature of the electrolyte used, either to a compact alumina, or to a porous alumina.

In the first case, the so-called "barrier" layer has a thickness which is only dependent on the voltage applied for its formation (1.4 nm/V), the operating voltage necessarily being below the latter. Thus, when used under 500V, it is generally recommended that oxidation takes place under a higher voltage, e.g. at 600V and in this case a 850 nm (0.85 $\mu$m) thick layer is obtained.

In the second case, the layer which can be several dozen microns thick, has a porous structure containing a large number of very small diameter cylindrical holes, whose axes are perpendicular to the aluminium surface and which traverse most of the layer, whilst leaving at the bottom of the pores a compact barrier layer a few dozen nm thick.

However, it was found that none of these layers considered separately meets all the requirements. The compact layers, which can have satisfactory insulation resistances, are inappropriate for a good attachment of adhesive and conversely the porous layers, which give a good adhesion, have very inadequate electrical insulation properties.

It was therefore of interest to seek to combine the advantages of these two types of layers and to investigate treatment conditions by double anodization of aluminium with a view to obtaining the necessary electrical insulation, thermal conductivity and the capacity to be adhered well to metal films.

DESCRIPTION OF THE INVENTION

The invention therefore relates to an insulated metal substrate having an aluminium base, an insulant constituted by an alumina film obtained by the anodization of said base over at least one of its faces and at least one metal film to be transformed by chemical etching into a network of conductors, characterized in that said alumina film is formed by a uniform, compact zone adhering to the aluminium and having a thickness in excess of 500 nm and a porous layer with a rough outer surface.

Thus, the substrate according to the invention has the special feature of having a compact zone with a thickness greater than that normally encountered with such layers and which rarely exceeds 100 nm, said zone being covered by a porous layer having a very high external roughness favourable to its attachment to a metal film, which can e.g. be a sheet.

Preferably, the compact zone in contact with the aluminium has a thickness between 500 and 1200 nm, but better results are obtained in the thickness range 500 to 1000 nm. If the thickness is below 500 nm the electrical insulation is inadequate, whereas in the case of thickness greater than 1200 nm, the thermal conductivity becomes inadequate.

The porous layer preferably has a thickness between 5000 and 50,000 nm (5 to 50 μm), which can be reduced to 15,000 to 30,000 (15 to 30 μm) in order to further refine the results. If the thickness of said layer is below 5 μm, the attachment of the metal film is inadequate, whereas when it exceeds 50 μm it only leads to a reduced improvement to the adhesion.

The attached photographs illustrate these two aspects. Photograph 1, which has a magnification of 25,000, shows the adhesive, uniform compact zone in contact with the aluminium covered by a porous layer.

It must be compared with photograph 2 having the same magnification, but using a base coated with an oxide film according to the prior art, where it is clear that the compact zone at the bottom of the pores has a thickness more than 10 times less than that of the zone according to the invention. Photograph 3, which has a magnification of 3200, shows the considerable roughness of the outer surface of the porous layer. This surface should be compared with that of photograph 4 produced with a magnification of 25,000 on an aluminium base covered only with a porous layer, where it is possible to see a very planar, crackled outer surface.

Figure 1:
FIG. 1 is a photomicrograph, at a magnification of 25,000, showing a compact thick non-porous zone in contact with an aluminium substrate of a laminate, and a very thick porous rough surfaced zone in contact with the compact zone, in accordance with the present invention.
Figure 2:
FIG. 2 is a photomicrograph, at a magnification of 25,000, showing an aluminium substrate coated with an oxide film, as in the prior art, which oxide film is very thin.
Figure 3:
FIG. 3 is a photomicrograph, at a magnification of 3,200, showing the roughness of the outer surface of an uppermost porous layer of the laminate of the present invention to which may be secured a metal film capable of forming a conductive network, or printed circuit.
Figure 4:
FIG. 4 is a photomicrograph, at a magnification of 25,000, showing the very planar, crackled outer surface of an uppermost porous layer of a printed circuit receiving member as in the prior art.
Figure 5:
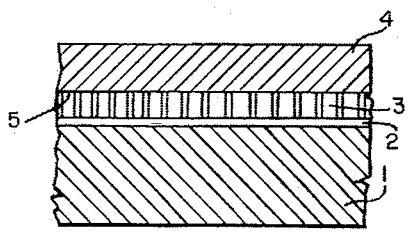
FIG. 5 is a greatly enlarged fragmentary schematic cross-section view of the insulated metal substrate of FIG. 1, with a metal film adhered thereto optionally by an adhesive layer.

As seen in FIG. 5, consisting of a greatly enlarged fragmentary schematic cross-section view of the insulated metal substrate 1 of FIG. 1, a metal film 4 is adhered thereto optionally by an adhesive layer 5 carried by the porous layer 3.

This difference reveals that the invention is not merely a juxtapositioning of a porous layer and a compact layer according to the prior art, but instead consists of a very special covering, namely a porous film with a strong barrier layer and an outer surface with a novel profile.

Apart from their good thermal conductivity, anodic alumina films with such a structure have the principle characteristics that the oxide adheres perfectly to the aluminium, the insulation resistance under 500V exceeds $10^5 M \Omega$, the oxide quantity giving this insulation resistance can be limited to a thickness of 10 to 25 μm and the roughness of the outer surface is very favourable to the attachment of a metal film capable of forming a conductive network.

Therefore these films lend themselves particularly well to the production of insulated metal substrates, because it is possible to apply to their surface a conductive film, e.g. with the aid of one of a number of methods considered separately or in combination. The first consists of bonding an electrodeposited copper sheet with a thickness of e.g. 35 μm and the adhesive can be deposited beforehand on either the alumina or on the copper. This adhesive is preferably chosen from the group formed by acrylic and epoxy resins and make it possible to adapt the expansion coefficient differences between these conductors and the alumina and consequently to withstand the relative displacements undergone by the conductors during the thermal cycles of the etched circuits. Another method is the chemical copper coating of the alumina following activation by metal salts and electrolytic recharging by either the subtractive or so-called panel plating method, or the semi-additive or so-called pattern plating method, in order to have an adequate copper thickness and in this case it must be ensured that the structure of the conductive metal corresponds to an adequate deformation capacity to withstand the relative displacements produced by the heat cycles. Another method is vacuum evaporation of copper in film form or any other physical deposition method, followed once again by an electrolytic recharging by panel plating or pattern plating. The final method is screen process printing of conductive polymer inks, e.g. based on copper.

Most aluminium alloys can be used as the base for obtaining particular layers. However, the alloys of series 1000 according to the Aluminium Association standards, on file with the U.S. Bureau of Standards, are preferred, because they give oxide characteristics best meeting the present requirements. These bases can both have a planar shape, optionally provided with holes, whose diameter and position are in accordance with the final intended use, or a spatial shape, e.g., nonplanar shape, optionally provided with holes, whose morphology is related to the final intended use.

Preferably, the metal film is of copper. However, it could also belong to the group constituted by constantan and chrome-nickel alloys, when the substrates are intended for the production of resistive networks.

The invention also relates to a process for obtaining these substrates.

This process is characterized in that the aluminium base is exposed on at least one of its faces to a treatment in a porous anodization bath and then in a barrier anodization bath. Thus, the process involves a bi-anodization and which starts with a porous anodization, the compact zone then developing under the porous layer.

Initially, the aluminium base is degreased and then scoured or pickled, e.g. in aqueous sulphochromic acid solutions, followed by careful rinsing. It then undergoes porous anodization, which is obtained with the aid of an electrolyte belonging to the group constituted by sulphuric acid, sulphosalicylic acid, chromic acid, phosphoric acid and any combination of at least two of these acids. Preference is given to sulphosalicylic acid, which is generally used in autocoloured oxidation of aluminium and which gives pores having a very good attachment power.

Finally, the base coated in this way with its porous film undergoes further anodization during which the compact zone is developed using an electrolytic bath belonging to the group of salts in aqueous solution constitute by ammonium tartrate, ammonium borate, potassium chromate, ammonium nitrate and any combination of at least two of said salts. These bi-anodized layers can then undergo sealing by immersing for 5 to 10 minutes in boiling water.

The plating of the conductive film onto the anodic alumina can be carried out in the case of bonding, by using various adhesives, which are preferably chosen from among acrylic or epoxy resins, which are generally very suitable for copper sheets. However, if the conductive layer is produced from a physical thin film deposition method, it is generally recommended to deposit a first coating of thickness approximately 1 $\mu$m before carrying out the electrolytic recharging, which could e.g. reach a thickness of 35 $\mu$m.

The invention is not limited to the production of substrates for single face interconnection circuits and is also suitable for producing substrates for circuits with a "double face and metallized holes". In this case the main production sequences are e.g. making holes in the aluminium plate, bi-anodization of the latter on both faces and within the holes, copper coating the entire outer surface of the alumina, either by a chemical method with activation by metal salts, or by a physical method and then electrolytic recharging by panel plating or pattern plating.

Another variant of the process, which is less advantageous from the heat dissipation standpoint, consists of bonding to appropriately anodized aluminium a circuit having a double face and with metallized holes of a conventional construction with an epoxy glass insulant between the two copper sheets, and which has been previously etched. The generalization of this principle leads to an insulated metal substrate for multilayer conductive circuits.

The invention is also suitable for producing insulated metal substrates with a spatial configuration. This shaping by bending, stamping, pressing or even machining can be initially applied to the aluminium sheet, followed by the same production sequences as indicated hereinbefore, i.e. bi-anodization and copper coating.

The invention can also be used for producing resistive networks obtained by the chemical etching of a thin metal sheet of constantan or chrome-nickel alloy.

The invention is illustrated by the following application examples:

EXAMPLE 1

Sheets of aluminium alloy of types 1050 and 1199 were previously degreased by means of an alkaline solution sold under the name DIVERSEY D 708 at a rate of 15 g/l and at a temperature of 65° C. They were then rinsed before being pickled with a sulphochromic acid solution containing approximately 150 g/l of $H_2SO_4$ and 50 g/l of $CrO_3$, followed by careful rinsing. The sheets then underwent an autocolouring anodization in a bath containing 100 g/l of sulphosalicylic acid at 20° C., whilst passing through a direct current of 2A/dm$^2$/face for approximately 40 min., so as to develop an on average 25 $\mu$m thick porous oxide coating. After rinsing with water, the sheets underwent a second anodization in a solution of boric acid $H_3BO_3$ at 70 g/l and ammonia, so as to obtain a chemical resistance close to 3500 $\Omega$. The average voltage of the direct current was 200V and the current quantity consumed 180 cb/dm$^2$. The compact oxide layer obtained was on average 1 $\mu$m.

After rinsing and drying, the thus obtained substrates underwent insulation resistance measurements under 500V and application times of one minute. The insulant of the substrates was then precoated with 25 $\mu$m thick acrylic adhesive sheets and covered with a 35 $\mu$m thick electrodeposited copper layer. The assembly was then pressed for 1 hour at 180° C. under 6.7 MPa and underwent tests to determine its peel strength. The test results appear in the following table, which also gives the results of insulation resistance measurements carried out on substrates which had undergone a single anodization in a sulphosalicylic medium under the conditions described hereinbefore, as well as the peel strength measurements performed after combination with the metal film produced under the same conditions as hereinbefore.

TABLE

| Aluminium type | | Bi-anodization (according to the invention) | | | | Mono-anodization | |
|---|---|---|---|---|---|---|---|
| | | 1050 | | 1199 | | 1050 | 1199 |
| Sample No. | | 1 | 2 | 3 | 4 | 1 | 3 |
| Insulation resistance in $10^5 M\Omega$ | R ave. | 4.46 | 5.61 | 13.8 | 14.7 | 0.08 | 0.17 |
| | R min. | 2.0 | 3.5 | 7 | 11.5 | 0.02 | 0.14 |
| | R max. | 6.5 | 7.0 | >15.0 | >15.0 | 0.15 | 0.20 |
| Peel strength in N/mm | | 3 | 3.08 | 2.9 | 2.95 | 2.75 | 2.75 |

Whilst improving the adhesion qualities, the table shows that bianodization multiplies by at least a factor of 50 the insulation resistances.

EXAMPLE 2

Sheets of aluminium of type 1050 were bi-anodized under the conditions of example 1, except with regards to the first anodization, which was carried out in a bath containing 180 g/l of sulphuric acid at 18° C., accompanied by the passage of a direct current of 1.5 A/dm$^2$/face for 60 minutes, so as to develop an on average 25 μm thick porous oxide layer.

The following insulation resistances were measured on the thus obtained substrates:

| | | |
|---|---|---|
| Insulation | R ave. | 1.62 |
| resistance | R min. | 1.1 |
| in 10$^5$MΩ | R max. | 2.7 |
| Peel strength in N/mm | | 2.7 |

The resistance values are slightly less satisfactory than with sulphosalicylic acid, but are still better than those obtained by mono-anodization.

We claim:

1. A process for the production of insulated metal substrates having an aluminium base, an insulant constituted by an alumina film obtained by anodization of said base on at least one of its faces and at least one metallic film for transformation by chemical etching into a conductive network, wherein the alumina film is formed of a uniform compact non-porous amorphous zone on at least one surface of the aluminium base and a porous layer with a rough outer surface comprising the steps of: subjecting at least one of the faces of the aluminium base to treatment in a porous anodization bath; followed by treatment of the at least one porous anodized face in a barrier anodization bath.

2. Process according to claim 1, wherein in the step of subjecting the at least one of the faces to the porous anodization bath the bath comprises an electrolyte selected from the group of acids consisting of sulphuric acid, sulphosalicylic acid, chromic acid, phosphoric acid and any combination of at least two of said acids.

3. Process according to claim 2, wherein the porous anodization bath is formed by sulphosalicylic acid.

4. Process according to claim 1, wherein in the step of subjecting the at least one of the faces to the anodization bath the bath comprises an electrolyte selected from the group of salts in aqueous solution consisting of ammonium tartrate, ammonium borate, potassium chromate, ammonium citrate and any combination of at least two of said salts.

5. Process according to claim 4, wherein the anodization bath is formed by ammonium borate.

6. Process according to claim 1, wherein the metallic film is obtained by the steps of physical vacuum deposition and then electrolytic recharging.

7. Process according to claim 1, wherein the compact zone is of about 500 nm to about 1200 nm and the treatment in the porous anodization bath results in the porous layer being bout 5,000 nm to about 50,000 nm with a rough outer surface.

* * * * *